United States Patent
Franke et al.

(10) Patent No.: US 6,756,164 B2
(45) Date of Patent: Jun. 29, 2004

(54) EXPOSURE MASK WITH REPAIRED DUMMY STRUCTURE AND METHOD OF REPAIRING AN EXPOSURE MASK

(75) Inventors: Torsten Franke, München (DE); Henning Haffner, Dresden (DE); Armin Semmler, München (DE); Martin Verbeek, München (DE)

(73) Assignee: Infineon Technologies AG, Munich (DE)

( * ) Notice: Subject to any disclaimer, the term of this patent is extended or adjusted under 35 U.S.C. 154(b) by 170 days.

(21) Appl. No.: 10/186,113

(22) Filed: Jun. 28, 2002

(65) Prior Publication Data

US 2003/0003377 A1 Jan. 2, 2003

(30) Foreign Application Priority Data

Jun. 28, 2001  (DE) .......................................... 101 31 187

(51) Int. Cl.[7] .................................................. G03F 9/00
(52) U.S. Cl. .............................................. 430/5; 430/30
(58) Field of Search ........................ 430/5, 30; 378/34, 378/35; 382/144

(56) References Cited

U.S. PATENT DOCUMENTS

| | | | | |
|---|---|---|---|---|
| 5,965,303 A | * | 10/1999 | Huang | ........................... 430/5 |
| 6,068,952 A | * | 5/2000 | Narimatsu et al. | ............. 430/5 |
| 6,312,854 B1 | | 11/2001 | Chen et al. | |
| 6,361,904 B1 | * | 3/2002 | Chiu | .............................. 430/5 |
| 6,596,465 B1 | * | 7/2003 | Mangat et al. | .............. 430/311 |
| 6,627,363 B1 | * | 9/2003 | Wen et al. | ...................... 430/5 |
| 6,653,029 B2 | * | 11/2003 | Lin et al. | ........................ 430/5 |

FOREIGN PATENT DOCUMENTS

WO    WO 99/47981    9/1999

* cited by examiner

Primary Examiner—Mark I. Huff
Assistant Examiner—Saleha Mohamedulla
(74) Attorney, Agent, or Firm—Laurence A. Greenberg; Werner E. Stemer; Ralph E. Locher

(57) ABSTRACT

An exposure mask has a phase mask and a phase-shifting dummy structure. The exposure mask can be repaired with regard to defects in the dummy structure. For that purpose, repair structures are applied on the exposure mask substrate material which have a lower phase shift compared to the dummy structures. The repair structure is preferably produced from carbon, the carbon being applied in a suitable layer thickness such that the repair structure no longer permits any transmission. In a preferred embodiment, the repair structure is arranged laterally offset with respect to the defect in the dummy structure.

12 Claims, 2 Drawing Sheets

EXPOSURE MASK WITH REPAIRED DUMMY STRUCTURE AND METHOD OF REPAIRING AN EXPOSURE MASK

BACKGROUND OF THE INVENTION

Field of the Invention

The invention relates to an exposure mask having a substrate to which a phase mask, which at least partially attenuates radiation, is applied. A phase-shifting dummy structure, which influences the optical properties of the radiation but is not visible in an exposed image, is applied to the substrate. The dummy structure has a defect and a repair structure for the defect in the dummy structure is applied to the substrate. The repair structure has a greater width than the dummy structure. Exposure masks are used, for example, in semiconductor technology to produce etch structures. For exposure of small structures, it is necessary to use phase masks as exposure masks in order to achieve a high resolution of the structures which are to be exposed. Phase masks have a phase-shifting property and, moreover, a low transmission. The phase shift of the radiation passing through the phase mask results in more precise imaging of the phase mask on a substrate that is to be exposed, such as for example a photoresist.

Furthermore, it has been found that arranging phase-shifting dummy structures on the exposure mask further improves the resolution of the structures which are to be exposed. A phase-shifting dummy structure leads to the electromagnetic field of the radiation being influenced in such a manner that the structure which is to be imaged can be imaged accurately without the dummy structure itself appearing during an exposure operation. The use of dummy structures—referred to as anti-scattering bars (ASBs)—is described, for example, in international PCT publication WO 99/47981 and U.S. Pat. No. 6,312,854 B1.

During the fabrication of very small structures, which are required, for example, for the fabrication of semiconductor components, in particular semiconductor memory components, the dummy structures are very narrow at least in terms of width. Therefore, the dummy structures are fabricated from a material which can be applied at low cost to exposure masks in the required geometries. In this case, by way of example, a molybdenum silicide layer is used, which has a low transmission in the region of 6% and effects a phase shift with respect to the substrate material, which preferably consists of glass, of 110 to 180° C. If defects, such as for example interrupted dummy structures, occur during fabrication of the dummy structure, these defects are repaired using a repair layer. In previous repair methods, repair structures which have substantially the same optical properties as the dummy structure have been applied.

SUMMARY OF THE INVENTION

It is accordingly an object of the invention to provide an exposure mask with a repaired blind structure and a method for repairing an exposure mask, which overcome the above-mentioned disadvantages of the heretofore-known devices and methods of this general type and which leads to an exposure mask with improved optical property.

With the foregoing and other objects in view there is provided, in accordance with the invention, an exposure exposure mask formed on a substrate, the mask comprising:

a phase mask for at least partially attenuating radiation;

a phase-shifting dummy structure formed to influence an optical property of the radiation but to be substantially invisible in an exposed image, said dummy structure having a defect; and a repair structure for repairing the defect in said dummy structure, said repair structure having a greater width than said dummy structure and having a lower phase shift than said dummy structure with respect to a material of the substrate.

A significant advantage of the novel exposure mask is that the repair structure has a lower phase shift than the dummy structure with respect to the substrate material. Tests have shown that, on account of the broader geometry of the repair structure, it is advantageous to use a repair structure with a lower phase shift with respect to the substrate material than the phase shift which is produced by the dummy structure. In this way, a greater optical quality of the exposure mask can be achieved.

With the above and other objects in view there is also provided, in accordance with the invention, a method of repairing an exposure mask on a substrate, the mask having a phase mask on the substrate, for at least partially attenuating radiation and generating an exposure structure during exposure. The method comprises the following method steps:

forming a phase-shifting dummy structure on the substrate, for influencing optical properties of the radiation but not producing an exposure structure upon an exposure, the dummy structure having a defect;

forming a repair structure on the substrate, for repairing the defect, the repair structure having a greater width than the defect, and the repair structure is produced from a material having a lower phase shift than the dummy structure with respect to the substrate material.

In accordance with an added feature of the invention, the repair structure has a lower transmissivity than the dummy structure. Forming the repair structure from a material which has a lower transmission coefficient than the dummy structure results in an improved optical property of the exposure mask during exposure.

A particularly simple and inexpensive embodiment of the exposure mask is achieved by the fact that a repair structure which allows substantially no transmission is used, i.e., when the repair structure is substantially opaque. This minimizes the phase shift of the repair structure in a simple manner.

The repair structure preferably does not have any phase shift with respect to the substrate material. This allows optimum formation of the repair structure.

In accordance with an additional feature of the invention, which provides for a simple and inexpensive embodiment of the repair structure, the material of the structure is at least partly composed of carbon. It is preferable for the repair structure to consist only of a carbon compound. The use of carbon offers a simple and inexpensive method for producing the repair structure with the required small feature size.

In a simple embodiment, the repair structure is oriented substantially in accordance with the dummy structure and arranged symmetrically above the defect with respect to a longitudinal axis of the dummy structure.

Tests have shown that, depending on the structure of the dummy structures, a laterally offset arrangement of the repair structure with respect to the defect but at substantially the same height as the defect results in an exposure mask with improved optical properties.

Other features which are considered as characteristic for the invention are set forth in the appended claims.

Although the invention is illustrated and described herein as embodied in an exposure mask with repaired dummy structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
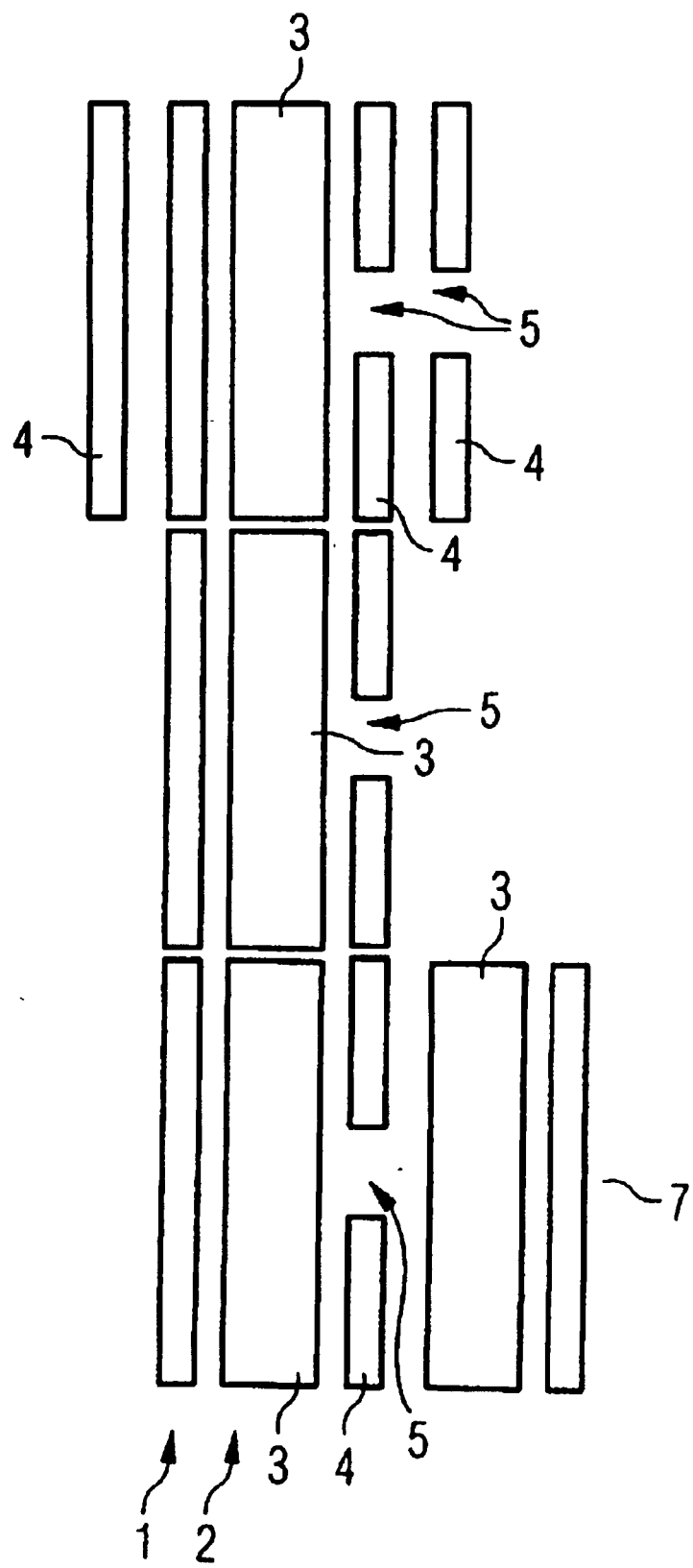
FIG. 1 is a diagrammatic plan view of an exposure mask with dummy structures which have defects.

Referring now to the figures of the drawing in detail and first, particularly, to FIG. 1 thereof, there is shown an excerpt from an exposure mask 1 which is applied to a substrate 7 and has a phase mask 2. The phase mask 2 comprises three phase-shifting strip-like layers 3 which are arranged on one axis. Dummy structures 4 are in each case arranged laterally offset with respect to the layers 3. The dummy structures 4 are arranged parallel to the layers 3, in the form of narrow strip-like layers. The dummy structures 4 preferably have the same length as the layers 3. FIG. 1 shows dummy structures 4 which have defects 5 and are of interrupted design. The defects 5 lead to a deterioration in the optical property of the exposure mask, and consequently need to be repaired.

Figure 2:
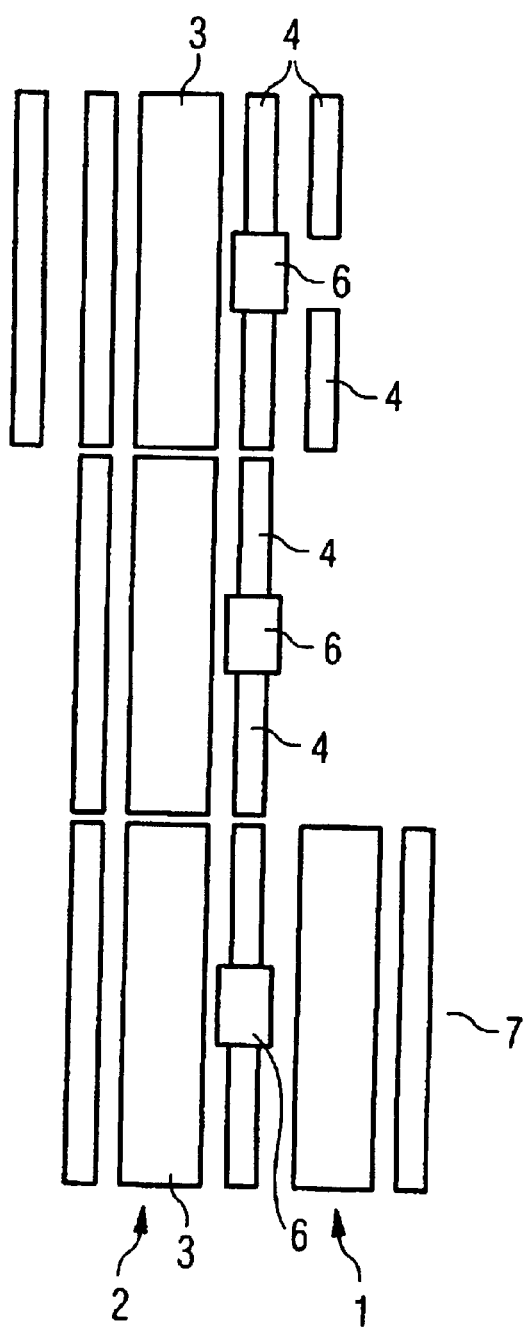
FIG. 2 is a diagrammatic plan view of an exposure mask with a first embodiment of a repair structure according to the invention.

FIG. 2 shows the exposure mask 1 shown in FIG. 1 wherein the defects 5 in the dummy structures 4 have been repaired by repair structures 6. In the selected embodiment, the repair structures 6 are arranged symmetrically on the defects 5 and have a greater thickness than the dummy structures 4. The greater thickness results from technological reasons, since it would be technologically highly complex to apply correspondingly thin repair structures 6.

A repair structure 6 substantially comprises a layer which, as optical property, has a lower phase shift with respect to the material of the substrate 7 of the exposure mask 1 than the repaired dummy structure 4. Furthermore, the repair structure 6 preferably has a lower transmission coefficient than the repaired dummy structure 4.

Particularly good results with regard to the optical properties of the exposure mask 1 were achieved by the use of carbon as material for the repair structures 6. It is preferable to apply a carbon layer to the exposure mask 1 in a thickness which is so great that the transmission is lower than in the dummy structure 4 and is preferably close to 0% transmission. This has the simultaneous result of causing the repair structure to impart a lower phase shift to radiation than the dummy structure 4.

Tests have shown that, if there are defects 5 which occur at the same height in adjacent dummy structures 4, it is advantageous for only the defect 5 which is closer to the layer 3 of the phase mask 2 to be repaired by a repair structure 6.

Figure 3:
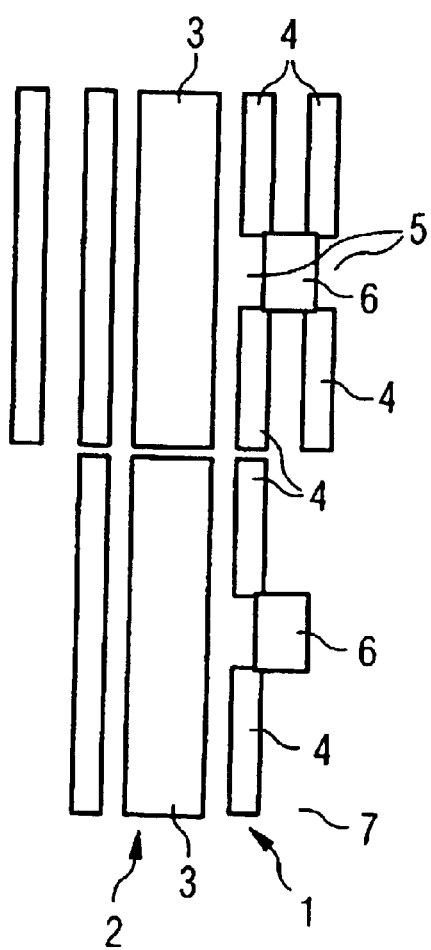
FIG. 3 is a similar view of an exposure mask with a second embodiment of a repair structure according to the invention.

FIG. 3 shows a further advantageous embodiment of a repaired exposure mask which has the same structure of the phase mask 2 as FIG. 2 and the same structure of the dummy structure 4 with the defects 5 as that shown in FIG. 2. Unlike in FIG. 2, however, the defects 5 have been repaired with repair structures 6 which are arranged laterally offset with respect to the defects 5. The repair structures 6 are arranged offset outwardly away from the layer 3 of the phase mask 2. In this case, however, the repair structures 6 are arranged at the same height as the defect 5. The length of the repair structure 6 is at least equal to the length of the defect 5. The width of the repair structure 6 is greater than the width of the dummy structure 4.

The lateral offset of the repair structures 6 with respect to the defects 5 is advantageous both where there is a single defect 5 in a dummy structure 4 and where there are two defects 5 in two adjacent dummy structures 4. In this case, to repair two adjacent defects 5, it is sufficient if a single repair structure 6 is arranged between the two defects 5. This repair solution is illustrated in the top right-hand part of FIG. 3. It is therefore not necessary for a repair structure 6 to be provided for each of the two defects 5. Rather, it is sufficient to form a single repair structure 6 in order to achieve good optical properties of the repaired dummy structure 4.

As an alternative to the material carbon which has been described for the repair structure 6, it is possible to use any other material which has the desired electromagnetic properties with regard to the exposure radiation used for the exposure mask 1.

The exposure mask 1 is applied to a substrate 7 which is usually produced from glass. Another suitable material for forming the repair structure 6 is chromium, which can easily be applied to the substrate 7 in the form of a repair structure 6 with a transmission coefficient of 0%.

We claim:

1. An exposure mask formed on a substrate, the mask comprising:

a phase mask for at least partially attenuating radiation;

a phase-shifting dummy structure formed to influence an optical property of the radiation but to be substantially invisible in an exposed image, said dummy structure having a defect; and a repair structure for repairing the defect in said dummy structure, said repair structure having a greater width than said dummy structure and having a lower phase shift than said dummy structure with respect to a material of the substrate.

2. The exposure mask according to claim 1, wherein said repair structure has a lower transmission than said dummy structure.

3. The exposure mask according to claim 2, wherein said repair structure is substantially opaque.

4. The exposure mask according to claim 3, wherein said repair structure is at least partly composed of carbon.

5. The exposure mask according to claim 1, wherein said repair structure is oriented substantially symmetrically with respect to said dummy structure.

6. The exposure mask according to claim 1, wherein said repair structure is arranged laterally with respect to said dummy structure and at an equal height as the defect in said dummy structure.

7. A method of repairing an exposure mask on a substrate, the mask having a phase mask on the substrate, for at least partially attenuating radiation and generating an exposure structure during exposure, the method which comprises:

forming a phase-shifting dummy structure on the substrate, for influencing optical properties of the radiation but not producing an exposure structure upon an exposure, the dummy structure having a defect;

forming a repair structure on the substrate, for repairing the defect, the repair structure having a greater width than the defect, and the repair structure is produced from a material having a lower phase shift than the dummy structure with respect to the substrate material.

8. The method according to claim 7, which comprises forming the repair structure by applying a material having a lower transmission than the dummy structure.

9. The method according to claim 7, which comprises forming the repair structure laterally offset with respect to the dummy structure, at an equal height with the defect.

10. The method according to claim 7, which comprises forming the repair structure as a carbon layer.

11. The method according to claim 7, which comprises forming the repair structure as a carbon layer with relatively low transmissivity.

12. The method according to claim 7, which comprises forming the repair structure as a substantially opaque layer.

* * * * *